United States Patent
Yordem et al.

(10) Patent No.: US 10,348,239 B2
(45) Date of Patent: Jul. 9, 2019

(54) MULTI-LAYERED SOLAR CELL DEVICE

(71) Applicant: 3M INNOVATIVE PROPERTIES COMPANY, St. Paul, MN (US)

(72) Inventors: Onur S. Yordem, St. Paul, MN (US); Gilles J. B. Benoit, Minneapolis, MN (US); Jingfei Chen, Shanghai (CN); Guanglei Du, Beijing (CN); Yan Yan Zhang, Shanghai (CN); Jiao Liu, Shanghai (CN); Bo Guo, Shanghai (CN); Timothy J. Hebrink, Scandia, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 889 days.

(21) Appl. No.: 13/875,505

(22) Filed: May 2, 2013

(65) Prior Publication Data
US 2014/0326292 A1 Nov. 6, 2014

(51) Int. Cl.
| | |
|---|---|
| *H02N 6/00* | (2006.01) |
| *H01L 31/042* | (2014.01) |
| *H02S 40/22* | (2014.01) |
| *H01L 31/048* | (2014.01) |

(52) U.S. Cl.
CPC ........... *H02S 40/22* (2014.12); *H01L 31/048* (2013.01); *Y02E 10/52* (2013.01)

(58) Field of Classification Search
CPC ............. H01L 31/048; H01L 31/056; H01L 31/02162; H01L 31/0216; H01L 31/02168
USPC .................................................. 136/246, 256
See application file for complete search history.

(56) References Cited

U.S. PATENT DOCUMENTS

| | | | |
|---|---|---|---|
| 4,751,191 A | 6/1988 | Gonsiorawski | |
| 5,074,920 A | 12/1991 | Gonsiorawski | |
| 5,118,362 A | 6/1992 | St. Angelo | |
| 5,178,683 A | 1/1993 | Takamura | |
| 5,192,944 A | 3/1993 | Qtsuki | |
| 5,278,694 A * | 1/1994 | Wheatley | B32B 7/02 |
| | | | 359/359 |
| 5,320,684 A | 6/1994 | Amick | |
| 5,478,402 A * | 12/1995 | Hanoka | B32B 17/10036 |
| | | | 136/251 |
| 5,782,995 A | 7/1998 | Nanya | |

(Continued)

FOREIGN PATENT DOCUMENTS

| | | |
|---|---|---|
| DE | 20214872 | 2/2003 |
| EP | 2051124 | 4/2009 |

(Continued)

OTHER PUBLICATIONS

Kelley, U.S. Appl. No. 13/775,415, entitled "Film Constructions for Interdigitated Electrodes with Bus Bars and Methods of Making Same," filed Feb. 25, 2013.

*Primary Examiner* — Angelo Trivisonno
(74) *Attorney, Agent, or Firm* — Clifton F. Richardson

(57) ABSTRACT

Multi-layered solar cell devices covered with partially transmissive graphic films. The multi-layered solar cell devices include at least one solar cell, a graphics layer over the solar cell, and a reflective layer. The reflective layer can be behind the solar cell for recycling light or between the partially transmissive graphic film and the solar cell for improved appearance. The multi-layered solar cell devices have a high efficiency and a customizable appearance.

21 Claims, 3 Drawing Sheets

(56) References Cited

U.S. PATENT DOCUMENTS

| | | | |
|---|---|---|---|
| 5,807,440 A | 9/1998 | Kubota | |
| 5,882,774 A * | 3/1999 | Jonza | B29C 55/023 359/577 |
| 6,208,466 B1 * | 3/2001 | Liu | G02B 5/021 359/584 |
| 6,490,819 B1 | 12/2002 | Kumata et al. | |
| 7,351,277 B2 | 4/2008 | Jackson | |
| 7,682,034 B2 | 3/2010 | Asvadi | |
| 7,912,590 B2 | 3/2011 | Wilkes | |
| 8,608,363 B2 | 12/2013 | Weber | |
| 2001/0004900 A1 * | 6/2001 | Ziegler | H01L 31/056 136/256 |
| 2006/0130889 A1 | 6/2006 | Li | |
| 2006/0268554 A1 * | 11/2006 | Whitehead | G09F 13/14 362/341 |
| 2007/0277810 A1 * | 12/2007 | Stock | H01L 31/048 126/569 |
| 2009/0101192 A1 * | 4/2009 | Kothari | G02B 5/285 136/246 |
| 2009/0129210 A1 | 5/2009 | Yamaguchi et al. | |
| 2010/0206352 A1 | 8/2010 | Gee | |
| 2010/0238686 A1 * | 9/2010 | Weber | G02B 6/0055 362/609 |
| 2010/0284055 A1 | 11/2010 | Kothari et al. | |
| 2012/0027945 A1 | 2/2012 | Kolb | |
| 2012/0038990 A1 * | 2/2012 | Hao | G02B 5/0242 359/599 |
| 2012/0085005 A1 | 4/2012 | Mackler | |
| 2014/0299175 A1 | 10/2014 | Gilbert | |

FOREIGN PATENT DOCUMENTS

| | | |
|---|---|---|
| JP | 60148174 | 8/1985 |
| JP | 11282389 | 10/1999 |
| JP | 2001-281354 | 10/2001 |
| JP | 2002-131733 | 5/2002 |
| JP | 2010-152189 | 7/2010 |
| JP | 3170629 | 9/2011 |
| JP | 3170629 U | 9/2011 |
| WO | WO 96-19347 | 6/1996 |
| WO | WO 02-072368 | 9/2002 |
| WO | WO 2008-152574 | 12/2008 |
| WO | WO 2009-063822 | 5/2009 |
| WO | WO 2009-089236 | 7/2009 |
| WO | WO 2010-151388 | 12/2010 |
| WO | WO 2012-082549 | 6/2012 |
| WO | WO 2012-154803 | 11/2012 |
| WO | WO 2013-019766 | 2/2013 |
| WO | WO 2013-056747 | 4/2013 |

\* cited by examiner

MULTI-LAYERED SOLAR CELL DEVICE

BACKGROUND

Solar cell devices are used to convert light energy into electrical energy. In order for a solar cell device to be cost effective, a high efficiency is required. In many instances it may be desirable to alter the appearance of solar cell devices for aesthetic purposes. However, it has proven difficult to modify the appearance of a solar cell device without sacrificing too much efficiency.

There is a need in the art for a solar cell device with a high efficiency and a customizable appearance.

SUMMARY

A first multi-layered solar cell device consistent with the present disclosure includes a reflector, a partially transmissive graphic film and a plurality of solar cells positioned between the reflector and the partially transmissive graphic film. A first gap separates the reflector and the plurality of solar cells, and a second gap separates the partially transmissive graphic film and the plurality of solar cells. The plurality of solar cells are spaced apart from each other such that open areas of the reflector are not covered by the plurality of solar cells.

A second multi-layered solar cell device consistent with the present disclosure includes a solar cell, a spectrally selective reflector, a diffuser and a graphics layer. The diffuser is positioned between the spectrally selective reflector and the graphics layer. The spectrally selective reflector is positioned adjacent to the solar cell.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

Figure 1A:
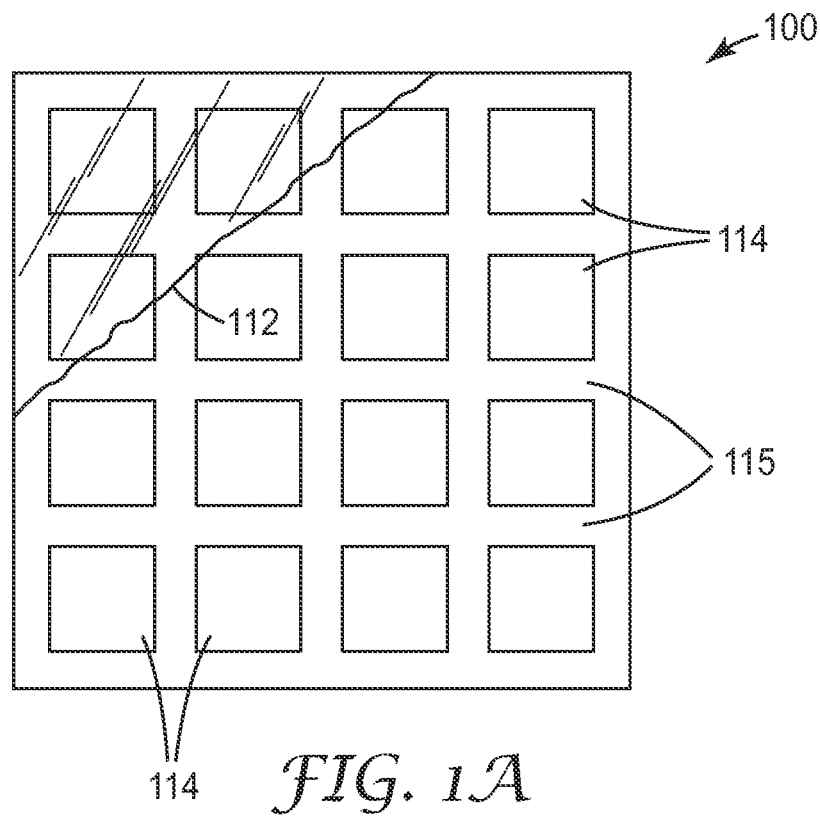
FIG. 1A is a plan view of a multi-layered solar cell device.

Embodiments of the present disclosure include multi-layered solar cell devices having at least one solar cell, a graphics layer and a reflective layer. Incorporating a graphics layer allows the appearance of the solar cell device to be customizable or otherwise altered. For example, it may be desirable to incorporate a wood grain graphic in order to give the solar cell device an appearance which integrates well into building environments. As another example, it may be desirable to incorporate advertising graphics onto a solar cell device for billboard applications.

Embodiments of the present disclosure include a multi-layered solar cell device containing a plurality of solar cells with a partially transmissive graphic film on one side of the device and a reflector on the opposite side. The partially transmissive graphic film allows light to enter the device. A portion of this light is absorbed by the solar cells and a portion is transmitted through spaces between the plurality of solar cells. The reflector reflects a portion of the light transmitted through the spaces between the plurality of solar cells back towards the solar cells.

Various elements may be included to increase the transport of light in the plane of the device. The plane of the device refers to a plane between the reflector and the partially transmissive graphic film. In embodiments where the plurality of solar cells occupies a common plane, the plane of the device is this common plane. In some embodiments, the reflector may include light spreading structures that spread the light in the plane of the device. In other embodiments, the region between the reflector and the solar cells contains an encapsulant that contains light redirecting elements that increase the transport of light in the plane of the device.

A multi-layered solar cell device may include a reflector, a plurality of solar cells positioned adjacent the reflector, and a partially transmissive graphic film positioned adjacent the plurality of solar cells on a side opposite the reflector; where a first gap separates the reflector and the plurality of solar cells, a second gap separates the partially transmissive graphic film and the plurality of solar cells, and the plurality of solar cells are spaced apart from each other such that open areas of the reflector are not covered by the plurality of solar cells; and where at least one of the first gap or the second gap includes light redirecting elements that increase the transport of light in a direction parallel to a plane of the multi-layered solar cell device.

A large fraction of the light that is transported in the plane of the device is trapped inside the device by the reflector at the bottom surface and by Fresnel and/or total internal reflection (TIR) at the top surface until it is absorbed by a solar cell. It has been found that the power output of the multi-layered solar cell device can be high even if the partially transmissive film contains a graphic blocking 70% of the incident light.

Figure 1B:
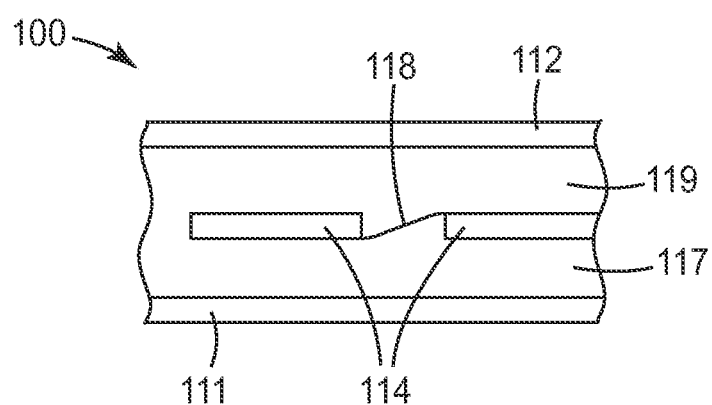
FIG. 1B is a fragmentary cross-sectional view of a portion of the multi-layered solar cell device of FIG. 1A.

FIGS. 1A and 1B are plan and cross-sectional views, respectively, of a solar cell device 100. Solar cell device 100 includes a plurality of rectangular solar cells 114, although the shape, size, and number of solar cells may be different from the illustrated embodiment. Each solar cell typically comprises a front contact on its front surface in the form of a grid comprising an array of narrow, elongate parallel fingers interconnected by one or more bus bars, and a rear contact on its rear surface. Solar cells may be photovoltaic cells and may be made, for example, as illustrated and described U.S. Pat. Nos. 4,751,191, 5,074,920, 5,118,362, 5,178,683, 5,320,684 and 5,478,402. The solar cells are typically arranged in parallel rows and columns although other configurations may be useful. Referring to FIG. 1B, solar cells 114 are typically interconnected by electrical leads 118 which usually are in the form of flat copper ribbons. In FIG. 1B, adjacent cells in a string are connected in series by soldering, or otherwise electrically connecting, one end of a flexible copper ribbon 118 to the back electrode of one solar cell and soldering the opposite end of the same ribbon to a bus bar of the front contact on the next succeeding solar cell. In some embodiments, the plurality of solar cells 114 has active areas on both a top surface and on a bottom surface opposite the top surface.

In the embodiment illustrated in FIG. 1B, the solar cell device 100 includes a reflector 111 behind the plurality of solar cells opposite graphic film 112. Reflector 111 may include a multilayer optical film. Reflector 111 has a total front surface area At and the reflector 111 has open regions 115 that are not covered by the plurality of solar cells. The open regions 115 have a surface area Ao. In some embodiments, Ao/At is at least about 0.05 or at least about 0.1.

In some embodiments, an encapsulant is included in the first gap or region 117 between solar cells 114 and reflector 111 or in the second gap or region 119 between partially transmissive graphic film 112 and solar cells 114. In the embodiment shown in FIG. 1B, an encapsulant is interposed between reflector 111 and partially transmissive graphic film 112 in the first gap 117, in the second gap 119, and surrounding solar cells 114 and their electrical connector ribbons 118. The encapsulant is typically made of suitable light-transparent, electrically non-conducting material. An exemplary useful encapsulant is the ethylene vinyl acetate copolymer known in the trade as "EVA", or a polyolefin copolymer, or an ionomer. Typically, an encapsulant is provided in the form of discrete sheets that are positioned below and on top of the plurality of solar cells 114, with those components in turn being sandwiched between the reflector 111 and the partially transmissive graphic film 112. Subsequently that sandwich is typically heated under vacuum, causing the encapsulant sheets to become liquified enough to flow around and encapsulate the cells and simultaneously fill any voids in the space between the front cover and the back sheet that may result from evacuation of air. Upon cooling, the liquified encapsulant solidifies and is cured in situ to form a transparent solid matrix that envelops the cells and fully fills the space between reflector 111 and partially transmissive graphic film 112 that is not occupied by the mutually spaced cells and the components that form their electrical interconnections. The encapsulant adheres to the front and back sheets so as to form a laminated subassembly. The encapsulant and the particular arrangement of the solar cells can be chosen to enable different applications such as flat, conformal or flexible solar collectors. The linear density of solar cells can be minimized in the direction of highest desired curvature.

In some embodiments, the solar cell device is provided with and secured to a surrounding frame, with a sealant usually disposed between the frame and the edges of the laminated subassembly. The frame may be made of metal or molded of a suitable material such as an organic plastic or elastomer material. Although not shown, it is to be understood that a solar cell device such as shown in FIGS. 1A and 1B also can be provided with electrical terminals for connecting the module to another module or directly into an electrical circuit, with the terminals usually being affixed to the reflector. Additionally, the solar cell device or a portion thereof may be reinforced, for example, by injection cladding, corrugation, or addition of ribs, foam spacer layers, or honeycomb structures to improve its dimensional stability.

Figure 2:
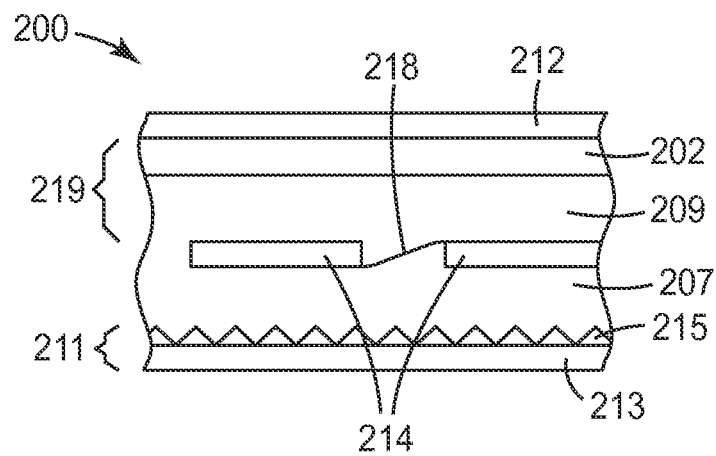
FIG. 2 is a fragmentary cross-sectional view of a portion of a multi-layered solar cell device.

In the embodiment shown in FIG. 2, the gap or region 219 between the solar cells 214 and the partially transmissive graphic film 212 includes a first material 209 adjacent to the plurality of solar cells 214 having a refractive index n1 and a second material 202 having a refractive index n2 between the first material 209 and the partially transmissive graphic film 212. The first material 209 may be an encapsulant and the second material 202 may be a glass layer and/or an optical clear adhesive. In some embodiments, the refractive indices are such that n1 is greater than or equal to n2. In this embodiment, the partially transmissive graphic film 212 may be removable from second material 202 so that it can be replaced with an alternate partially transmissive graphic film. This may be desirable for billboards, signs, architectural surfaces, or similar applications. In other embodiments, the refractive indices are such that n1-n2 is greater than or equal to 0.1. In this embodiment, the lower refractive index material 202 is used to improve transport by inducing total internal reflection.

The reflector can be implemented with a mirror film which can have the advantage of providing a high reflectivity. Mirror film can include multilayer polymeric films such as Enhanced Specular Reflector (ESR) film made by 3M Company (St. Paul, Minn.) and described in U.S. Pat. No. 5,882,774 to Jonza et al., which is hereby incorporated by reference in its entirety.

In an alternate embodiment the reflector comprises a white diffuse reflector. Suitable white diffuse reflectors include DuPont Diffuse Light Reflector available from DuPont, Wilmington, Del. and MCPET Reflective Light Sheets available from American Furukawa, Inc., Plymouth Township, Mich.

In other embodiments, the reflector is a semi-specular reflector. A semi-specular reflector provides a mixture of specular reflection and diffuse reflection. A suitable semi-specular reflector may comprise a specular reflector, such as ESR film, and a plurality of refractive elements adjacent to the specular reflector. In the embodiment shown in FIG. 2, multi-layered solar cell device 200 includes reflector 211, which includes specular reflector 213 and refractive elements 215. Examples of suitable refractive elements include beads, microlenses, lenticular lenses, Fresnel lenses, cube corner structures, prisms or any combination of these elements. A layer of refractive elements can be used to increase the spread of light in the plane of the device. Such a layer will be referred to herein as a light spreading layer. Including a light spreading layer with a specular reflector, increases the efficiency of the solar cell device since it aids in the trapping of light in the device increasing the probability that light will eventually be absorbed by a solar cell.

In the embodiment show in FIG. 2, an encapsulant is interposed between reflector 211 and partially transmissive graphic film 212 in the first gap 207, in the portion 209 of the second gap 219, and surrounding the solar cells 214 and their electrical connector ribbons 218.

An alternative to including a light spreading layer with the reflector is to incorporate light spreading elements in the gap or region between the solar cells and the reflector, or in the gap or region between the partially transmissive graphic film and the solar cells. These gaps typically contain an encapsulant. Filling the encapsulant with light spreading elements, such as glass beads or polystyrene beads or other particles capable of scattering light can improve efficiency by increasing the coupling of incident light into in-plane wave guided modes that have a high probability of being absorbed by the solar cells.

The reflector may comprise a cold mirror that reflects visible and near infrared light and transmits lower frequency light. Examples of suitable cold mirrors include those available from Edmund Optics, Inc., Barrington, N.J. In some embodiments, the reflector is a semi-specular reflector that reflects at least 80% of light in the wavelength range of 400 nm to 1100 nm and transmits at least 80% in the wavelength range of 1200 nm-2400 nm.

As used herein, a partially transmissive graphic film is any film that transmits at least some light having wavelengths in the visible or near infrared range and that reflects at least some light in the visible range where the reflected light contains some graphical content. The graphical content may include patterns, images or other visual indicia. The graphic film may be a printed film or the graphic may be created by means other than printing. For example, the partially transmissive graphic film may be perforated reflective film with a patterned arrangement of perforations. The graphic may also be created by embossing. Examples of embossed film include partially transmissive DI-NOC film, commercially available from 3M Company, St. Paul, Minn.

In some embodiments, the partially transmissive graphic film includes a graphic covering at least about 5% or at least about 10% or at least about 15% of the surface of the partially transmissive graphic film. In some embodiments, the partially transmissive graphic film includes a graphic covering less than about 65% or less than about 70% or less than about 75% of the surface of the partially transmissive graphic film.

The partially transmissive graphic film may be perforated film that is printable or otherwise imageable. A film is printable if it is capable of receiving an ink image. Useful perforated printable films include, for example, perforated clear vinyl films available from 3M Company, St. Paul, Minn. under the trade designation SCOTCHCAL Marking Film. In some embodiments, the partially transmissive graphic film may comprise a thermoplastic urethane and a cellulosic ester as described in PCT publication number WO 2013/019766, which is hereby incorporated herein by reference in its entirety.

An ink layer may be provided on at least one surface of the graphic film. In some embodiments, the ink layer creates a design. Imaging techniques suitable for imaging the film include ink jet printing, thermal mass transfer, flexography, dye sublimation, screen printing, electrostatic printing, offset printing, gravure printing or other printing processes. Useful inks include piezo ink jet inks, thermal transfer inks, ultraviolet curable inks, solvent based inks and latex inks.

A top coat may also be employed as a functional layer. The top coat may be polymeric, and, for example, may be made of fluoropolymers, polyurethanes, polycarbonates or polyacrylics or copolymer thereof. A topcoat may be used to modify surface characteristics, but may also be used as a protective layer, for example over an image. The topcoat may be a glass layer that protects a permanent graphic. This may be desirable for architectural, roofing, tiling or similar applications.

The partially transmissive graphic film may also be treated with a conventional primer coating, and/or activated by flame or corona discharge, and/or by other surface treatment to enhance adhesion of a functional layer and/or adhesive layer thereto.

In some embodiments, the partially transmissive graphic film is a perforated laminate that includes a graphic film layer and a reflective layer behind the graphic film layer. For example, a white reflective layer or a silvered reflective layer may be used behind a perforated graphic layer. In some embodiments, the partially transmissive graphic film is a translucent laminate that includes a translucent graphic film layer and a partially reflective layer behind the translucent graphic film layer.

As used herein, "efficiency" refers to the fraction of light intensity incident on the solar cell device that is absorbed by the solar cell device and "relative efficiency" is the ratio of the efficiency for a given graphic content to the efficiency with no applied graphics (i.e., when the partially transmissive graphic film is replaced with a fully transmissive film). The light input used to define efficiency may be sunlight at a specified location averaged over time of year and time of day or may be standard light source AM1.5. A large surface area of the solar cell device can be blocked by the partially transmissive graphic film while maintaining a high relative efficiency. As illustrated in the Examples, with a graphic coverage of 50%, the relative efficiency can be about 84%. Without intending to be limited by theory, it is believed that the relative efficiency drops slowly with increasing graphic coverage because although the graphic reduces the effective collection area of the device, it improves the trapping efficiency by reducing the probability of light escaping the device through the front surface.

The ratio of the intensity of light transmitted through a film to the intensity of light incident on the film is known in the art as the transmission level T of the film. In some embodiments of the multi-layered solar cell device, the partially transmissive graphic film has a transmission level T, the multilayered solar cell device has an efficiency E1, the plurality of solar cells have an efficiency E2, and E1 is greater than the product of T and E2.

The relative efficiency can be increased by including elements which increase both the trapping and the transport of light in the plane of the solar cell device such as including a low refractive index coating between the encapsulant and the graphic layer or including a light spreading layer with a specular reflector to increase the semi-specular character of the reflector. Quantitatively, the degree of semi-specularity (specular vs. Lambertian characteristic of a given reflector or other component) can be effectively characterized by comparing the fluxes of the forward- and back-scattered light components, referred to as F and B respectively. The forward and back-scattered fluxes can be obtained from the integrated reflection intensities (or integrated transmission intensities in the case of optically transmissive components) over all solid angles. The degree of semi-specularity can then be characterized by a "transport ratio" TR, given by:

$$TR=(F-B)/(F+B).$$

TR ranges from 0 to 1 as one moves from purely specular to purely Lambertian. For a pure specular reflector there is no back-scatter (B=0), and therefore TR=F/F=1. For a pure Lambertian reflector, the forward- and back-scattered fluxes are the same (F=B), and thus TR=0. The transport ratio for typical reflective or transmissive component is a function of incidence angle because the amount of forward-scattered light, for example, will be different for a near-normally incident ray than for a grazing-incident ray. In some embodiments, a multilayered solar cell device is provided that includes a reflector providing a transport ratio at 45 degree incidence that is less than or equal to 0.6 or 0.45 and that is greater than or equal to 0.0 or 0.1. If the spatial distribution of solar cells is anisotropic, then an anisotropic semi-specular reflector having different transport ratios in different directions may be used. In some embodiments, the density of solar cells is lower in a first direction than in a second direction and a semi-specular reflector with a higher transport ratio in the first direction is used. Such reflectors can be constructed using linear prisms with a specular reflector, for example.

In many embodiments, the solar cell device forms a light trapping cavity. The efficiency of the solar cell device depends on its ability to first scatter incident rays that are not directly absorbed by the solar cells into the plane of the cavity and then to transport the in-plane light until it is absorbed by a solar cell. Therefore, high efficiency is favored by a reflector with a low transport ratio (highly diffuse) for light having the average incidence angle of sunlight (which corresponds to leaky out-of-plane modes, i.e., modes that can escape the cavity) and a high transport ratio (highly specular) for light having the average incidence angle of in-plane light (trapped in-plane modes).

In some embodiments, there is an encapsulant between the reflector and the graphic layer. If there were no graphic layer, a light trapping cavity would be formed between the reflector and the encapsulant-air interface. For a typical encapsulant, the TIR angle at the air interface is around 40 degrees from normal, so rays traveling at angles between 0 and 40 degrees correspond to leaky modes, while rays propagating between 40 and 90 degrees correspond to TIR modes. Although it does not maximize efficiency, a Lambertian reflector can be used because it scatters any incident rays with equal probability within a full hemisphere. A solid-angle argument shows that the probability of coupling incident light into guided modes is about 75% while the probability of coupling into leaky modes is about 25%. The addition of a graphic further reduces the probability of leaky modes actually leaking out of the cavity.

Figure 3:
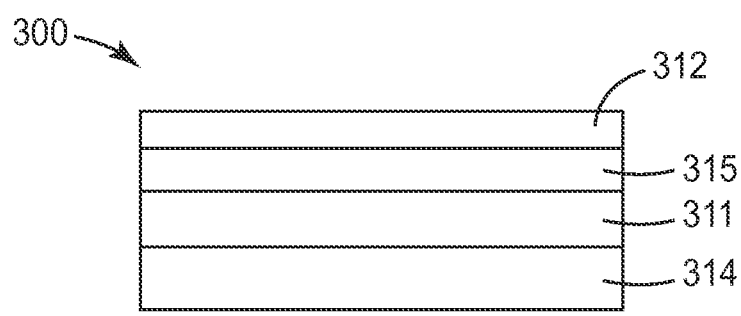
FIG. 3 is a cross-sectional view of a multi-layered solar cell device.

FIG. 3 is a side view of a multi-layered solar cell device 300 that includes, in the orientation shown, a solar cell 314, a spectrally selective reflector 311 adjacent the solar cell 314, a diffuser 315 adjacent the spectrally selective reflector, and a graphics layer 312 adjacent the diffuser 315. It has been found that a film stack including a combination of a spectrally selective reflector and a diffuser layer behind a graphics layer provides a balance of spectral and diffuse reflection resulting in improved display characteristics while allowing sufficient visible and/or near infrared (NIR) light to reach the solar cell so that high efficiencies can be achieved. Desired display characteristics provided by the multi-layered solar cell device include hiding the typically black solar cell behind the film stack and providing a natural appearing graphic.

Figure 4:
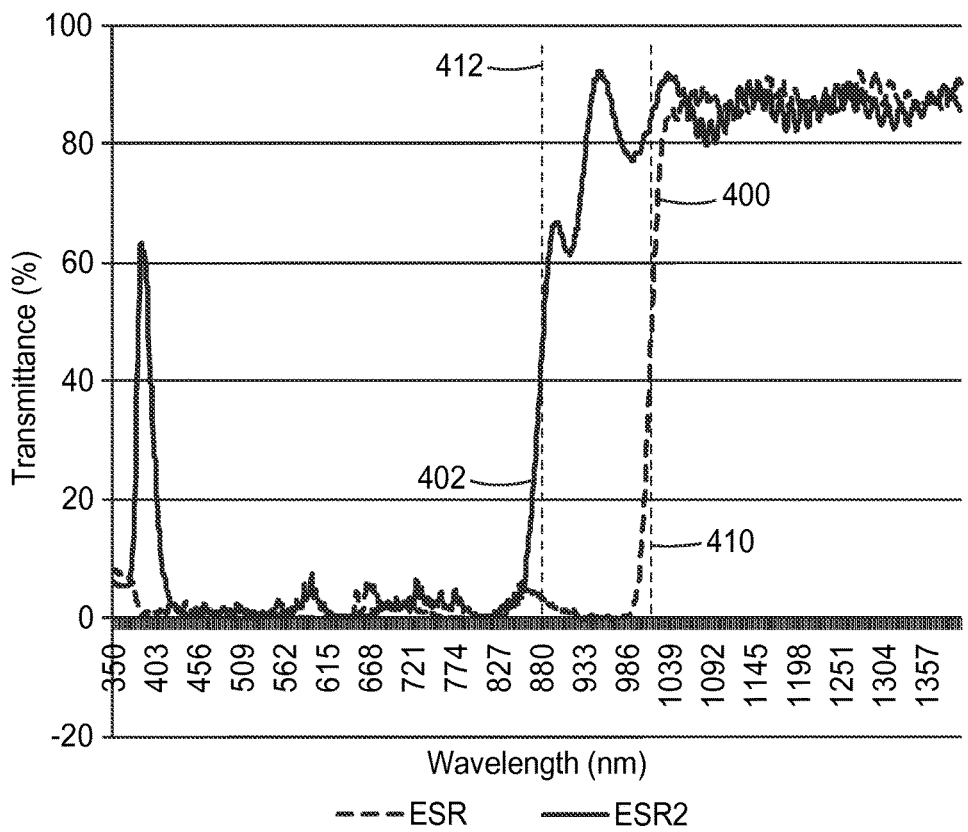
FIG. 4 is a graph of transmittance versus wavelength for spectrally selective reflectors.

A suitable spectrally selective reflector is multilayered polymeric film, such as ESR. ESR transmits very little light from wavelengths from about 400 nm to about 1000 nm. For wavelengths above about 1000 nm, ESR allows about 80-90% of incident light to be transmitted. The wavelength where this transition from relatively low transmission to relatively high transmission occurs will be referred to hereinafter as the "transmission threshold". Standard ESR can be modified to give improved performance when used above a solar cell by choosing layer thickness in the multilayer optical film to shift the reflective threshold to lower wavelengths as generally described in U.S. Pat. No. 5,882,774 to Jonza et al., previously incorporated by reference. By adjusting the film thicknesses of the layers in ESR, the transmission threshold can be shifted to lower values allowing more light to penetrate the reflective film and reach the solar cell. A suitable alternative to ESR is ESR2, which is commercially available from 3M Company, St Paul, Minn. ESR2 is a thinner version of ESR that transmits very little light in the visible range but transmits significant light having wavelengths higher than a transmission threshold of about 850 nm. The transmittance 400 of ESR and the transmittance 402 of ESR2 are shown in FIG. 4. The transmission threshold 410 of ESR and the transmission threshold 412 of ESR2 are indicated in FIG. 4.

In some embodiments, the spectrally selective reflector is perforated ESR film. Perforation may be done, for example, by using a laser to cut a plurality of holes in the film. Perforated ESR has been found to provide sufficient reflection to provide a high quality graphic display while allowing enough radiation to pass through to give a high efficiency.

The diffuser may be a beaded diffuser or a fiber diffuser. Other suitable diffusers are described in U.S. Pat. No. 7,682,034, PCT Publication Nos. WO 2008/152574 and WO 2012/082549 and Japan Pat. Application Publication No. 2010/152189. An approach for making ESR more transmissive is to apply a beaded diffuser layer directly to the ESR. Without intending to be limited by theory, the ESR is believed to become more transmissive when the beaded diffuser layer is applied because light incident on the film stack is refracted by the beaded diffuser layer and is then incident on the ESR layer at an angle of incidence where the transmission through the ESR is higher. Altering the transmission through a reflector in this way is generally described is U.S. Pat. No. 6,208,466 to Liu et al., which is hereby incorporated herein by reference in its entirety.

A suitable beaded diffuser includes beads having an index of refraction nb in a resin having an index of refraction nr. Suitable beads include glass, polystyrene, ceramic, $TiO_2$, $SiO_2$, $ZrO_2$, $BaSO_4$ and $CaCO_3$ particles. Useful resins include poly(methyl methacrylate) (PMMA), polycarbonate (PC), polyvinyl chloride (PVC), polystyrene (PS), polyester such as, but not limited to, polyethylene terephthalate (PET) and cyclo-olefins and copolymers thereof. In some embodiments, nb/nr is greater than about 1.05 or 1.06 or 1.07. In some embodiments, nb/nr is less than about 1.2 or 1.25 or 1.3. In some embodiments, the beads have diameters in the range from about 2 µm to about 8 µm. In some embodiments, the volume of the beaded diffuser layer includes a volume vb of beads and a volume vr of resin where vb/vr is greater than about 0.85 or 0.90 and less than about 1.20 or 1.25.

By perforating multilayer optical film, by adjusting the number of layers or the optical thicknesses of the layers, by applying a diffuser directly on the surface of the multilayer optical film, or by a combination of these techniques, both the transmission in the visible range and the transmission threshold can be adjusted to optimize the performance of the solar cell device. In some embodiments, the transmission threshold is in the range of 700 nm-850 nm. In some embodiments, the transmission coefficient for visible light at wavelengths below the transmission threshold is in the range of 20%-50%. As used herein, the "efficiency ratio" is the ratio of the efficiency of the solar cell covered with a film stack (with or without a graphic) to the efficiency without a film stack. The film stack can provide sufficient hiding of the solar cell for graphics application and the efficiency ratio can be about 70% when the transmission threshold is in the range of 700 nm-850 nm and when the transmission coefficient for visible light at wavelengths below the transmission threshold is in the range of 20%-50%.

In some embodiments, the spectrally selective reflector is attached to the solar cell using an optically clear adhesive. Optically coupling the spectrally selective reflector to the solar cell in this way has been found to improve the efficiency of the solar cell. Suitable optically clear adhesives include 3M Liquid Optically Clear Adhesive 2175 available from 3M Company, St. Paul. Minn.

In some embodiments, the diffuser includes a low index layer. The low index layer may be provided between the reflector and a beaded diffuser layer or between the graphics layer and a beaded diffuser layer. This has been found to enhance the appearance of the graphic. The low index layer may have an index of refraction less than about 1.4. In some embodiments, the low index layer is an ultra-low index (ULI) layer having an index of refraction less than about 1.35. A ULI layer may include a binder and a plurality of interconnected voids as described in U.S. Patent Application Publication No. 2012/0038990, which is hereby incorporated by reference herein in its entirety. A ULI layer can be applied to a surface by coating the surface with a first solution of a polymerizable material in a solvent; then at least partially polymerizing the polymerizable material to form a composition that includes an insoluble polymer matrix and a second solution, where the insoluble polymer matrix includes a plurality of nanovoids that are filled with the second solution; and then removing a major portion of the solvent from the second solution. Suitable methods for applying a ULI layer are described in U.S. Patent Application Publication No. 2012/0027945, which is hereby incorporated by reference herein in its entirety.

The graphics layer may be formed by printing onto a transparent substrate. For example, the graphics layer can be made by ink jet printing onto a polyvinylchloride (PVC) film. A transparent substrate containing a graphic may be adhered to the diffuser with an optically clear adhesive. In some embodiments, in order to prevent the optically clear adhesive layer from weakening the optical effects of the diffuser, the diffuser includes a first low index layer between the reflector and a diffusive layer and a second low index layer between the diffusive layer and the optically clear adhesive layer.

In some embodiments, the diffuser includes a low index layer and a beaded diffuser layer with the low index layer positioned between the beaded diffuser layer and a graphics layer. This allows the graphics layer to be applied directly to the beaded diffuser layer, for example, by ink jet printing or other printing techniques previously mentioned. The graphics layer may include a printed layer adjacent to the diffuser and a protective layer, such as a transparent film, opposite the diffuser in order to protect the printed layer from abrasions, for example.

In some embodiments, the graphics layer includes a colored adhesive. For example, a printed transparent film may be adhered to the diffuser using a tinted adhesive layer. This allows the appearance of the graphic to be tailored to have a desired tint. In some embodiments, the graphics layer includes an embossed pattern. Suitable embossed films include semi-transparent DI-NOC films available from 3M Company, St. Paul, Minn. A colored adhesive layer can be used to attach an embossed film to the diffuser in order to create a desired visual appearance and tactile feel.

In some embodiments, the graphics layer contains cyan, magenta, yellow and/or black (CMYK) inks CMYK inks can be formulated to have good transmission in the red and/or near infrared wavelengths. Suitable CMYK inks include those available from Teikoku Printing Inks Mfg. Co., LTD. (Tokyo, Japan) and those available from Epolin, Inc. (Newark, N.J.) such as SPECTRE 110 visibly-opaque IR-transmitting ink.

In the above description, layers, components, or elements are described as being adjacent one another. Layers, components, or elements can be adjacent one another by being in direct contact, by being connected through one or more other components, or by being held next to one another or attached to one another.

EXAMPLES

Example 1

A ray tracing program (ASAP available from Breault Research Organization, Inc., Tucson, Ariz.) was used to calculate the efficiency of a solar cell device similar to that shown in FIG. 2. A simulation cell containing a single solar cell was used with periodic boundary conditions imposed in the plane of the solar cell device. The solar cell had an area of 1 unit×1 unit; the simulation cell had an area of 5 units×5 units and a height of 0.14 units. The graphic layer was modeled as a regular array of squares. The graphic layer blocked light incident on the squares from outside the solar cell device and was modeled as a diffuse reflector for light incident from the back side of the squares with a hemispheric reflectivity of 96%. An array of 18×18 squares was used and the size of the squares was adjusted to achieve the desired area coverage. Beneath the graphic layer was a glass layer having a refractive index of 1.50 and a thickness of 0.01 units. The solar cell was encased in an encapsulant having a refractive index of 1.50 and positioned beneath the glass layer. The encapsulant thickness was 0.05 units above and below the solar cell. The solar cell material was taken to have a refractive index of 4.0. A mirror consisting of a specular reflector with a bead coating delivering a transport ratio at an incidence angle of 45 degrees equal to 0.25 was used. The thickness of the reflector with bead coating was 0.02 units. The specular reflector was a cool mirror film with a reflectivity of 96% in the visible range. The mirror was placed below the encapsulated solar cell with an adhesive layer between the encapsulant and the mirror modeled as a silicone adhesive having a refractive index of 1.41 and a thickness of 0.01 units. The solar cell material was modeled as 100% absorptive for light incident from above and 50% reflective for light incident from below after surface reflection. The light incident on the solar cell device was modeled as sunlight with the solar cell device facing South exposure in Minneapolis, Minn., USA and inclined by an angle of 25 deg (from vertical). The incident light was averaged over all days of the year and all times of the day.

The efficiency, defined as the fraction of light intensity incident on the simulation cell that is absorbed by the solar cell, was calculated. The relative efficiency, defined as the ratio of the efficiency for a given graphic content to the efficiency for no applied graphics, was determined as a function of graphic coverage. A strongly non-linear behavior was observed as shown in Table 1 below.

TABLE 1

| Area Covered (Percent) | Relative Efficiency (Percent) |
|---|---|
| 0 | 100 |
| 10 | 99.0 |
| 30 | 93.2 |
| 50 | 84.1 |
| 70 | 69.5 |
| 90 | 36.4 |
| 99 | 3.6 |

Example 2

The efficiency of a mono-crystal Si solar cell (commercially available from Changsha Guanghe Solar Co. Ltd., Changsha China, under the tradename GHM-5) covered and uncovered with various film stacks was measured under standard light source AM1.5. The film stacks are described in Table 2.

An ultra-low index (ULI) layer was prepared as described in Example 1 of U.S. Patent Application Publication No. 2012/0027945 and applied to the reflectors of Samples B, E and F as indicated in Table 2.

A composition for a beaded diffuser was prepared by mixing UVX4856 UV curable binder (available from 3M Company, St. Paul, Minn.), polystyrene beads having an average diameter of about 3 µm (available from Suzhou Soken Chemical Co. Ltd, Suzhou, China, under the tradename KSR-3) and ethyl acetate with a weight ratio of 7:8:24. For Samples C and D, the composition was coated directly onto a surface of the reflectors indicated in Table 2 and UV cured. For Samples B, E and F, the composition was coated onto ULI coated reflectors indicated in Table 2 and UV cured.

Figure 5:
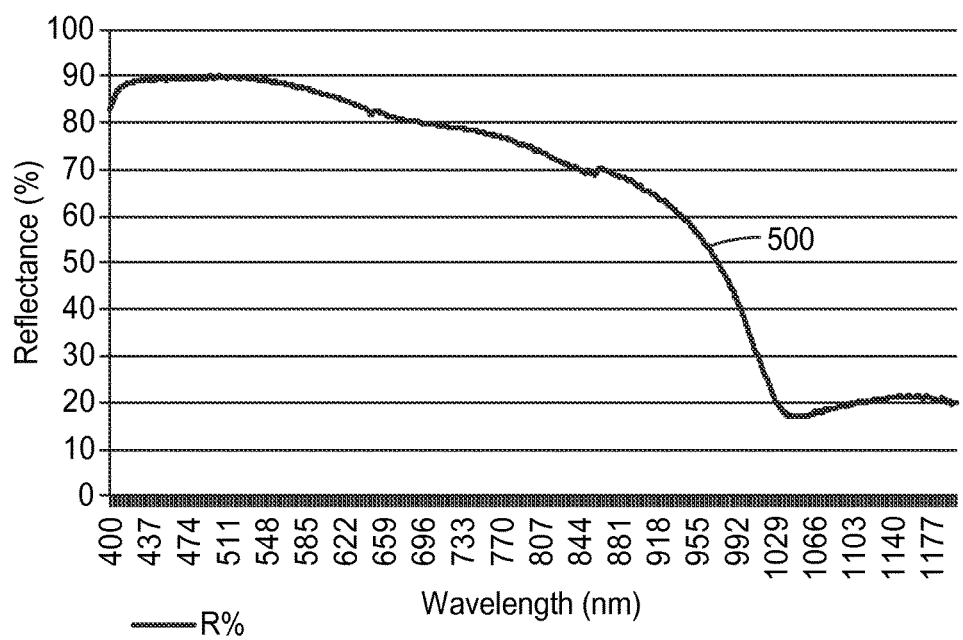
FIG. 5 is a graph of reflectance versus wavelength for a spectrally selective reflector having a beaded diffuser coating.

The reflectance 500 of the beaded diffuser coated directly onto a surface of ESR and adhered to the mono-crystal Si solar cell with 3M Liquid Optically Clear Adhesive 2175 (3M Company, St. Paul, Minn.) is show in FIG. 5. Comparing the reflectance 500 of FIG. 5 with the transmittance 400 of FIG. 4 and noting that the reflectance 500 is approximately 100% minus the transmittance of the beaded diffuser coated ESR, it can be seen that the beaded diffuser coating significantly increases transmittance for near infrared wavelengths.

For Samples E and F, printed PVC was adhered to the film stack. The PVC used was 3M SCOTCHCAL Clear View Graphic Film 8150, available from 3M Company, St. Paul Minn. This PVC film is supplied with a pressure sensitive adhesive on one side which was used to attach the PVC film to the film stack. A graphic was applied onto the PVC by ink jet printing using CMYK ink (Mimaki SPC-0440 ink cartridge available from Mimaki Engineering Co., Ltd., Nagano, Japan). The amount of ink applied was characterized by the average of each pixel's CMYK value expressed as a percentage. The average CMYK level was about 20% for magenta, about 40% for yellow, about 17% for black ink, and about 0% for cyan.

For Sample F, perforated ESR was used. The perforations were made by laser cutting holes about 0.8 mm in diameter into a sheet of ESR. About 12.5% of the area of the ESR sheet was removed by the laser cutting process.

The efficiency ratio, which is the ratio of the efficiency of the solar cell covered with a film stack to the efficiency without a film stack, was determined for the film stacks shown in Table 2. The efficiency was measured with the film stack covering the solar cell without adhesive and with the film stack attached to the solar cell with 3M Liquid Optically Clear Adhesive 2175 (3M Company, St. Paul, Minn.).

TABLE 2

| Sample | Film structure | Efficiency Ratio | |
| --- | --- | --- | --- |
| | | Covered | Adhered |
| A | ESR | 0.26 | 0.29 |
| B | beaded diffuser + ULI + ESR | 0.24 | 0.30 |
| C | Beaded diffuser + ESR | 0.22 | 0.53 |
| D | Beaded diffuser + ESR2 | 0.42 | 0.77 |
| E | Printed PVC + beaded diffuser + ULI + ESR | 0.24 | 0.28 |
| F | Printed PVC + beaded diffuser + ULI + perforated ESR | 0.31 | 0.36 |

Although specific embodiments have been illustrated and described herein, it will be appreciated by those of ordinary skill in the art that a variety of alternate implementations can be used for the specific embodiments shown and described without departing from the scope of the present disclosure. This application is intended to cover any adaptations or variations of the specific embodiments discussed herein.

The invention claimed is:

1. A multi-layered solar cell device, comprising:
a reflector;
a plurality of solar cells positioned adjacent the reflector; and
a partially transmissive graphic film positioned adjacent the plurality of solar cells on a side opposite the reflector,
wherein a first gap separates the reflector and the plurality of solar cells, a second gap separates the partially transmissive graphic film and the plurality of solar cells, and the plurality of solar cells are spaced apart from each other such that open areas of the reflector are not covered by the plurality of solar cells, and
wherein the partially transmissive graphic film comprises a perforated laminate comprising a graphic film layer and a reflective layer, the perforated laminate having a plurality of perforations that extend entirely through a thickness of the perforated laminate.

2. The multi-layered solar cell device of claim 1, wherein the partially transmissive graphic film comprises a graphic covering between about 10% and about 70% of a first major surface of the partially transmissive graphic film.

3. The multi-layered solar cell device of claim 1, wherein the reflector has a total front surface area At, the open areas of the reflector not covered by the plurality of solar cells has an area Ao and Ao/At is at least 0.05.

4. The multi-layered solar cell device of claim 1, wherein the plurality of solar cells has active areas on a top surface and on a bottom surface.

5. The multi-layered solar cell device of claim 1, wherein at least one of the first gap or the second gap comprises an encapsulant.

6. The multi-layered solar cell device of claim 1, wherein at least one of the first gap or the second gap comprises a glass layer.

7. The multi-layered solar cell device of claim 1, wherein at least one of the first gap or the second gap comprises light redirecting elements that increase the transport of light in a direction parallel to a plane of the multi-layered solar cell device.

8. The multi-layered solar cell device of claim 1, wherein the reflector comprises a semi-specular reflector.

9. The multi-layered solar cell device of claim 1, wherein the reflector comprises a white diffuse reflector.

10. The multi-layered solar cell device of claim 1, wherein the second gap comprises a first material adjacent the plurality of solar cells, the first material having refractive index n1, and a second material positioned between the first material and the partially transmissive graphic film, the second material having refractive index n2, wherein n1 is greater than or equal to n2.

11. The multi-layered solar cell device of claim 1, wherein the partially transmissive graphic film comprises a translucent laminate comprising a translucent graphic film layer and a partially reflective layer.

12. A multi-layered solar cell device, comprising:
a solar cell;
a spectrally selective reflector adjacent the solar cell;
a diffuser adjacent the spectrally selective reflector opposite the solar cell; and
a graphics layer adjacent the diffuser opposite the spectrally selective reflector,
wherein the spectrally selective reflector has a reflectivity of at least about 80 percent throughout a range of wavelengths from 400 nm to 700 nm.

13. The multi-layered solar cell device of claim 12, wherein the spectrally selective reflector is a multilayered polymeric film.

14. The multi-layered solar cell device of claim 12, wherein the spectrally selective reflector is perforated.

15. The multi-layered solar cell device of claim 12, wherein the diffuser comprises a beaded diffuser layer.

16. The multi-layered solar cell device of claim 12, wherein the diffuser comprises a layer having an index of refraction less than 1.35.

17. The multi-layered solar cell device of claim 12, wherein the graphics layer comprises a printed pattern on a surface of the diffuser opposite the spectrally selective reflector.

18. The multi-layered solar cell device of claim 12, wherein the graphics layer comprises a printed transparent substrate.

19. The multi-layered solar cell device of claim 12, wherein the graphics layer comprises a colored adhesive.

20. The multi-layered solar cell device of claim 12, wherein the graphics layer comprises a printed layer adjacent the diffuser and a protective layer opposite the diffuser.

21. The multi-layered solar cell device of claim 12, wherein the graphics layer comprises an embossed pattern.

* * * * *